United States Patent [19]
Furuhata et al.

[11] Patent Number: 5,202,619
[45] Date of Patent: Apr. 13, 1993

[54] CONTROL CIRCUIT FOR A SWITCHING TRANSISTOR

[75] Inventors: Shoichi Furuhata; Naoto Fujisawa; Seiki Igarashi, all of Kawasaki, Japan

[73] Assignee: Fuji Electric Co., Ltd., Kawasaki, Japan

[21] Appl. No.: 751,932

[22] Filed: Aug. 30, 1991

[30] Foreign Application Priority Data

Sep. 5, 1990 [JP] Japan .................................. 2-235119

[51] Int. Cl.⁵ .............................................. H02M 3/155
[52] U.S. Cl. ...................................... 323/349; 363/20; 361/159; 307/253; 307/300
[58] Field of Search ................... 323/349; 363/18, 19, 363/20, 21, 57, 95, 97, 131; 361/159; 307/98, 135, 253, 300

[56] References Cited

U.S. PATENT DOCUMENTS

4,093,877 6/1978 Pollmeier .................. 363/131 X
4,549,095 10/1985 Stefani et al. .
4,639,823 1/1987 Kuroki .

FOREIGN PATENT DOCUMENTS

60-139018 7/1985 Japan .
929786 6/1963 United Kingdom .
1529760 10/1978 United Kingdom .
2203308 10/1988 United Kingdom .

Primary Examiner—Emanuel T. Voeltz
Attorney, Agent, or Firm—Spencer, Frank & Schneider

[57] ABSTRACT

In a switching transistor control circuit, the switching transistor has a control electrode and first and second main circuit electrodes. A reactor is connected in series with the first main circuit electrode of the switching transistor to receive a main circuit current through the switching transistor. Circuitry is connected to an end of the reactor remote from the first main electrode and to the control electrode of the switching transistor, for supplying an electromotive force to the control electrode which is generated by the reactor as main circuit current decreases when the switching transistor is turned off. A control electrode driving circuit is connected to the control electrode, and is connected to one of the first main circuit electrode and a predetermined intermediate position on the reactor, for supplying a drive signal to the control electrode for selectively turning the switching transistor on and off.

20 Claims, 9 Drawing Sheets

CONTROL CIRCUIT FOR A SWITCHING TRANSISTOR

BACKGROUND OF THE INVENTION

1. Field of the Invention

The present invention relates to a control circuit for a switching transistor that may be used to perform a switching action, for example, in an inverter circuit or a switching electric power supply.

2. Background Information

A conventional control circuit for a switching transistor is known, for example, from Laid-Open Japanese Patent Application No. 60-139018 and corresponding U.S. Pat. No. 4,639,823, both commonly owned by the assignee of the present application.

Figure 1:
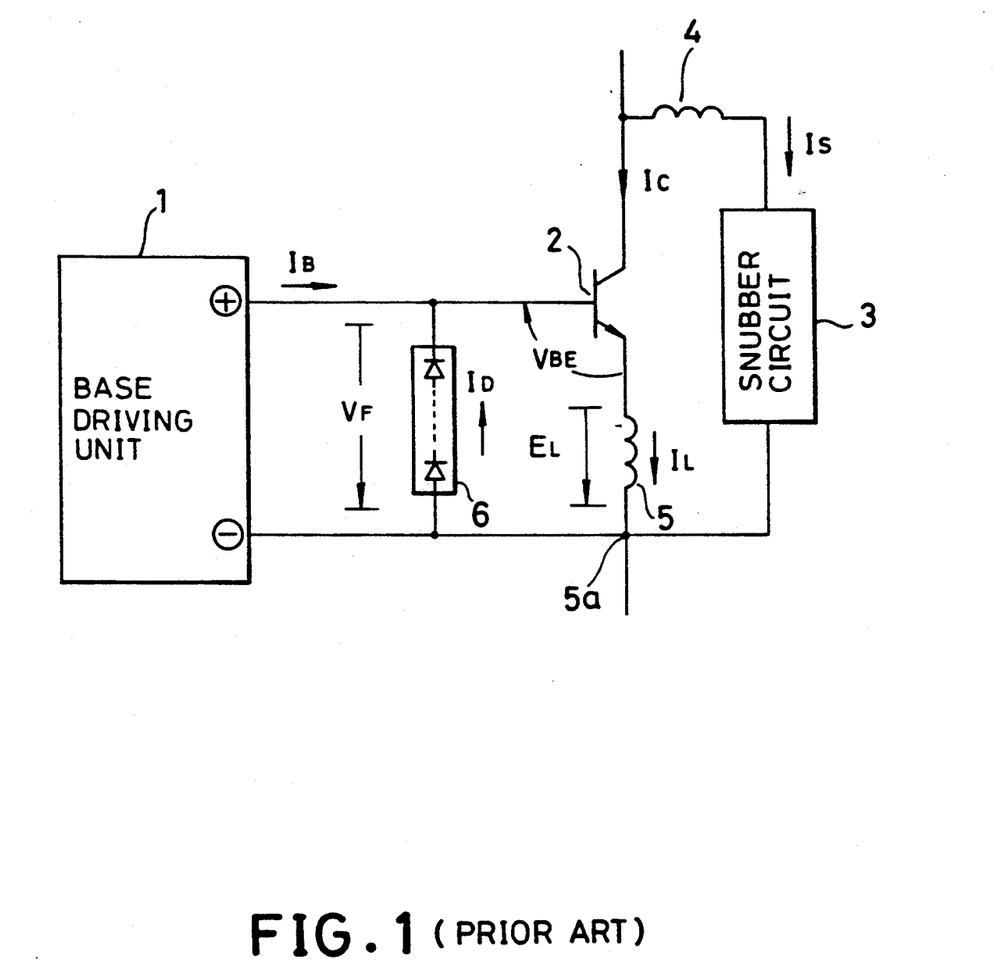
FIG. 1 is a circuit diagram showing a conventional control circuit for a switching transistor.

A prior art control circuit similar to that disclosed in the foregoing Japanese application and corresponding U.S. Patent is shown in FIG. 1, and FIGS. 2A-2D illustrate waveforms useful for explaining the operation of the control circuit in FIG. 1.

In FIGS. 1 and 2A-2D, items which are the same or equivalent to each other are referenced correspondingly. In FIG. 1, the circuit arrangement includes an NPN bipolar transistor 2 for performing the switching action, a reactor (inductor) 5 connected in series with the emitter of transistor 2 to which a current IL (Ic) from the main circuit is applied, and a base driving unit 1, which is well known, for driving the base-emitter circuit of transistor 2. Base driving unit 1 is connected between to the base of the transistor 2 and the end 5a of reactor 5 which is not connected to the emitter of transistor 2. A conventional snubber circuit 3, comprising for example a capacitor, resistor, diode etc., is connected to the collector of transistor 2 and end 5a of reactor 5. A distributed inductance of the snubber circuit and the conductors connecting the transistor to the snubber circuit 3 are represented by coil 4 connected between snubber circuit 3 and the collector of transistor 2. The energy stored in coil 4 while transistor 2 is turned on is applied to transistor 2 as a voltage spike when the transistor is turned off. Snubber circuit 3 reduces that spike voltage to less than a maximum allowable level. A diode arrangement 6, which may include a plurality of diodes connected in series, is connected between end 5a of reactor 5 and the base of transistor 2. Moreover, diode arrangement 6 is connected in a direction such that the electromotive force of reactor 5 which is generated as the current IL decreases when transistor 2 is switched off is applied to the base of the transistor through the diode arrangement 6.

Figure 2A:
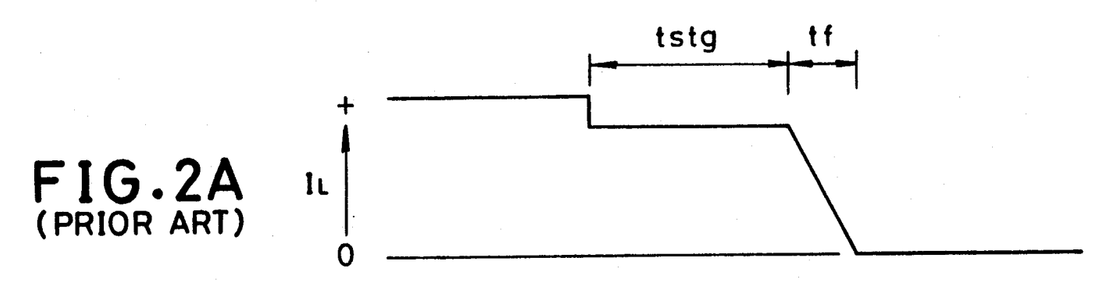
FIGS. 2A-2D are waveforms illustrating operation of portions in the circuit of FIG. 1.
Figure 2B:
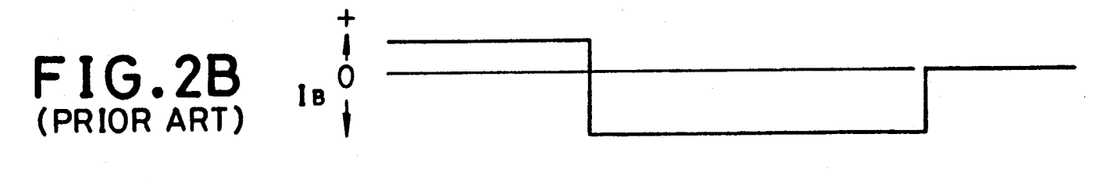
Figure 2C:
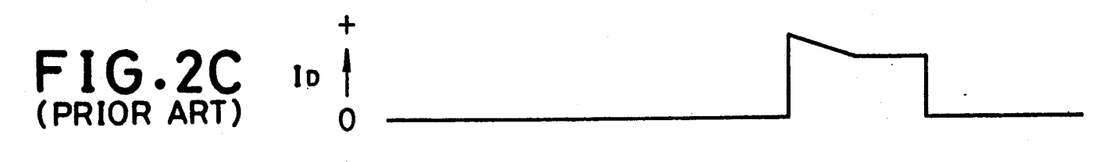
Figure 2D:
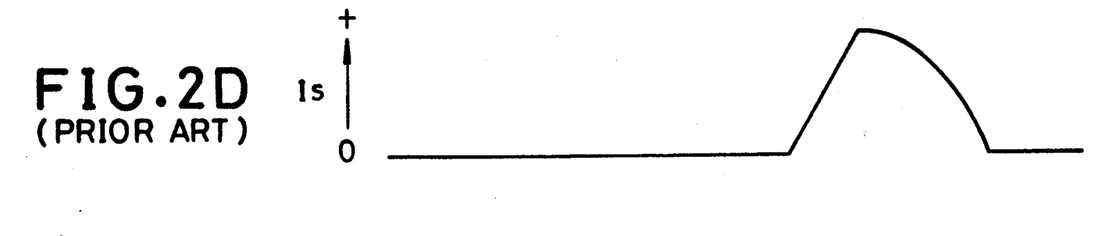

The operation of the circuit of FIG. 1 will be described with reference to FIGS. 2A-2D which show operational waveforms for portions of the circuit. As shown in FIG. 2B, when transistor 2 is on, a positive current IB is supplied from the base driving unit 1 to the base of the transistor 2, and a negative current is supplied to turn the transistor off. The collector current of transistor 2, which is nearly equal to the reactor current IL, starts decreasing after a storage time (tstg) and during a fall time (tf) when the current is supplied in the reverse direction from the emitter to the base of the transistor to switch the transistor 2 off as shown in FIG. 2A.

At this time, because the current IL of reactor starts decreasing as shown in FIG. 2A, an electromotive force EL is induced in reactor 5 with a polarity in which the terminal connected to the emitter of the transistor 2 becomes negative and the other terminal (5a) becomes positive. The electromotive force EL is given by $$EL = L * dIL/dt$$

where L is the inductance of reactor 5 and dIL/dt is the rate of change of current IL through inductance 5. Assuming that the forward voltage of the group of diodes 6 is VF and the voltage across the base and emitter of transistor 2 is VBE while the base driving unit 1 supplies a constant current −IB (inverse bias base current), the output current −IB of base driving unit 1 under the condition of EL<VBE+VF will follow the path of (−) terminal reactor 5→emitter→base→(+) terminal, so as to reduce the fall time (tf) of the collector current Ic and cause EL to increase.

Under the condition of EL>VBE+VF, the output current −IB of the base driving unit 1 will follow the path of (−) terminal→group of diodes 6→(+) terminal. At this time, the current from reactor 5 is led to the base of transistor 2 through the group of diodes, 6, acting to prolong the fall time (tf) of the collector current Ic and cause EL to decrease.

Based on the aforementioned operation, the current IL of reactor 5 shows a fall characteristic which satisfies the condition of EL≈VBE+VF. Since EL=L*DIL/dt, the fall characteristic (dIL/dt) may be adjusted by changing the forward voltage VF of the group of diodes 6 or the inductance L of the reactor, provided that VBE≈constant.

As above described, according to the prior art, it has become possible to maintain the storage time (tstg) at the time of switching transistor off and to adjust the fall time (tf) of the switching transistor. As a result, the rate of change (di/dt) of the current flowing in a snubber circuit for controlling overloading may be minimized, whereby the snubber circuit can be miniaturized. The quantity of the noise generated or reducible because the collector current drop rate (−dIc/dt) of the transistor 2 at the time of switching the transistor off can be minimized.

In the switching circuit shown in FIG. 1, the electromotive force EL of reactor 5 connected in series to the emitter of transistor 2 has the effect of preventing a rapid decrease of emitter current, acting to maintain the transistor 2 on when the transistor is switched off. On the other hand, a voltage is induced in reactor 5 of a polarity in which the terminal connected to the emitter of the transistor 2B and the other terminal thereof become positive and negative, respectively, when the transistor is switched from off to on. Since the positive and negative voltages are different in polarity from the base driving signals acting to switch the transistor 2B on and off, respectively, a problem arises in that the rate of increase of the driving (turn on) signal supplied to the base of the transistor is suppressed, and in turn, there is an increase of turn-on time, and turn-on losses of the transistor result. Furthermore, there is a problem that the number of parts in the circuit are increased by adding a reactor and a diode in the form of discrete components.

SUMMARY OF THE INVENTION

Accordingly, an object of the present invention is to provide a control circuit for a switching transistor which is capable of removing the foregoing problems by shortening the turn on time while maintaining the control function for the turn-off speed of the switching transistor.

The above and other objects of the invention are accomplished by providing a switching transistor having a control electrode and first and second main circuit electrodes; a reactor connected in series with the first main circuit electrode of the switching transistor to receive a main circuit current through the switching transistor; circuit means connected between an end of the reactor remote from the first main circuit electrode and the control electrode of the switching transistor for supplying an electromotive force, generated by the reactor as the current decreases when the switching transistor is turned off, to the control electrode of the switching transistor; and control electrode driving means, connected between the control electrode and one of the first main circuit electrode and a predetermined intermediate position on the reactor, for supplying a drive signal to the control electrode for controlling an on-off condition of the switching transistor.

According to the present invention, since the negative (−) terminal of the base driving unit 1 is connected to the emitter of the switching transistor 2 or an intermediate position on the reactor 5, the turn-on suppression due to the reactor 5 at the time of turning the transistor 2 on is minimized, while the function of controlling the turn-off speed of the transistor 2 caused by the electromotive force of the reactor 5 at the time of turning the transistor off is maintained.

The above and other objects, effects, features and advantages of the present invention will become more apparent from the following description of embodiments thereof taken in conjunction with the accompanying drawings.

BRIEF DESCRIPTION OF THE DRAWINGS

Further advantages of the invention will be apparent from a reading of the following description in conjunction with the accompanying drawings in which.

DETAILED DESCRIPTION OF PREFERRED EMBODIMENTS

Figure 3:
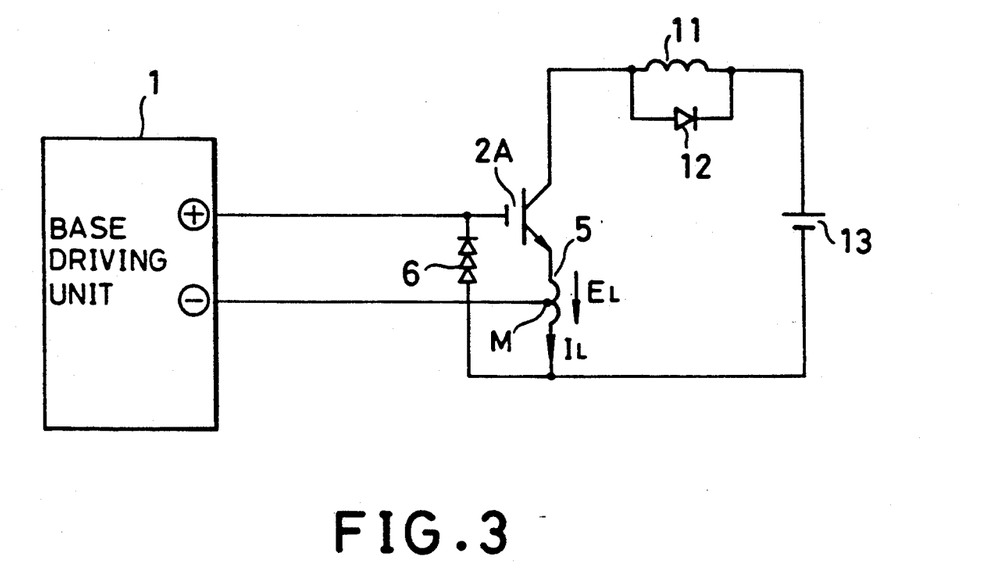
FIGS. 3-6 are circuit diagrams showing four embodiments of a control circuit in accordance with the present invention.

Various embodiments of the present invention will be described with reference to FIGS. 3 to 12, and contrasted with the prior art circuit of FIG. 1. FIG. 3 is a circuit diagram showing the configuration of a first embodiment of the present invention. In FIG. 3, a center tap M is added to the middle position of reactor 5 and is connected to the negative (−) terminal of base driving unit 1. In FIG. 3, although an insulated-gate bipolar (IGB) transistor 2A is used in place of switching transistor 2 shown in FIG. 1, it is not an essential difference for the present invention. The circuit arrangement includes an inductive load 11 connected in the main collector-emitter circuit, a commutating diode 12 connected in parallel with inductive load 11, and a direct voltage source 13 connected in the main circuit.

Figure 4:
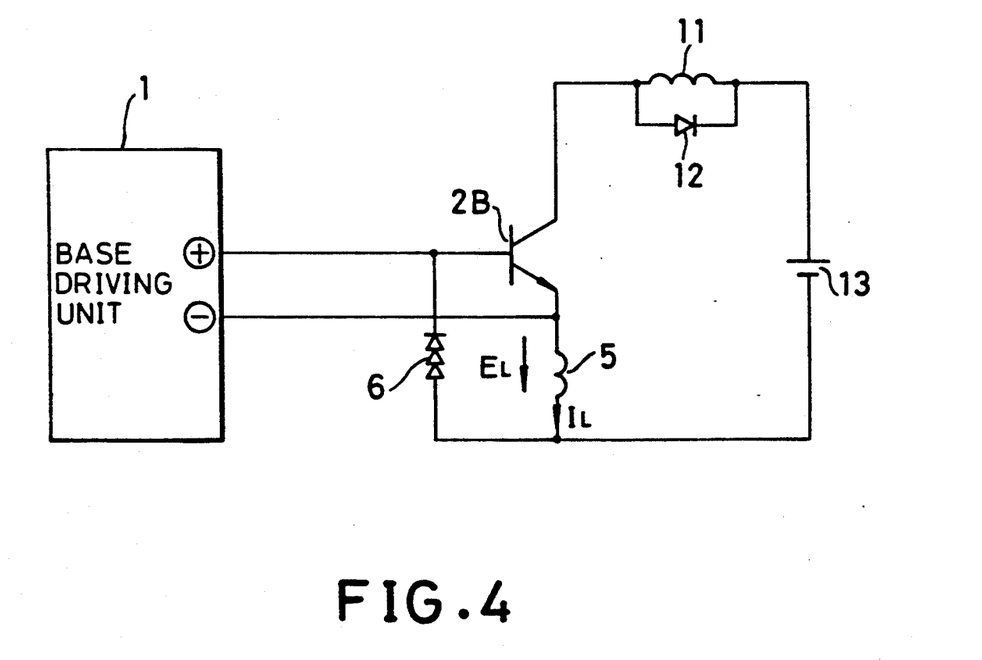

FIG. 4 shows a second embodiment of the present invention, in which a bipolar transistor 2B is used in place of the IGB transistor shown in FIG. 3, and the negative (−) terminal of the base driving unit 1 is connected directly to the emitter of transistor 2B.

By utilizing the switching circuits shown in FIG. 3 and FIG. 4, the turn-on time of transistors 2A and 2B can be shortened from the prior art shown in FIG. 1. More specifically, in FIG. 3, since the inductance of reactor 5, which represses the rise speed of the driving signal for IGB transistor 2A, includes the inductance of center top M up to the connecting point of the emitter of the IGB transistor, the turn-on time of IGB transistor 2A can be shortened. In FIG. 4, since there is no reactor in the base-emitter driving circuit, the turn-on speed of transistor 2B is not effected by reactor 5. The turn-on thereof can be made faster than in the case of FIG. 3.

As mentioned above, by shifting the position of center top M on reactor 5 forward or away from the emitter of transistor 2, the turn-on time of transistor 2 lengthened (delayed) or can be delayed.

On the other hand, since the electromotive force EL of reactor 5 is supplied to the base of the transistor (gate in case of the IGB transistor) through diodes 6 in order to prolong collector current when the switching transistor is turned off as described in connection with FIG. 1, the turn-off speed can be suppressed just as in the prior art circuit of FIG. 1 and can be changed by appropriately selecting the inductance value L of reactor 5, or the number of diodes constituting the plurality of diodes 6.

Figure 7A:
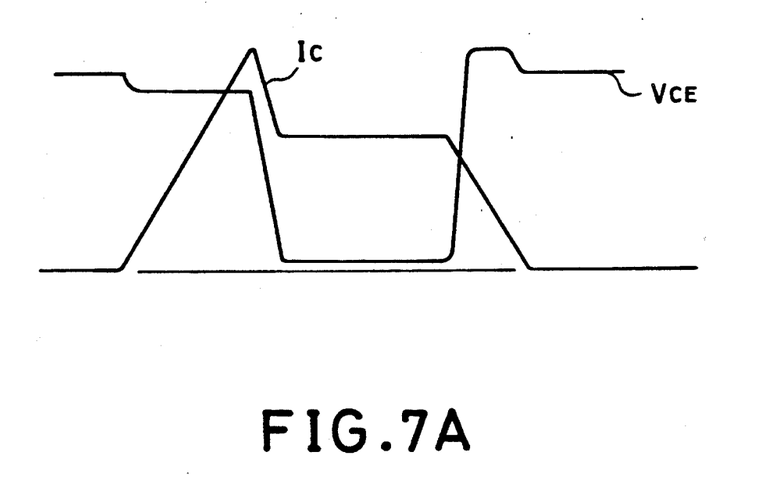
FIGS. 7A-7B are waveforms illustrating the characteristic of turn-on and turn-off of a transistor based on the present invention as compared with the prior art.
Figure 7B:
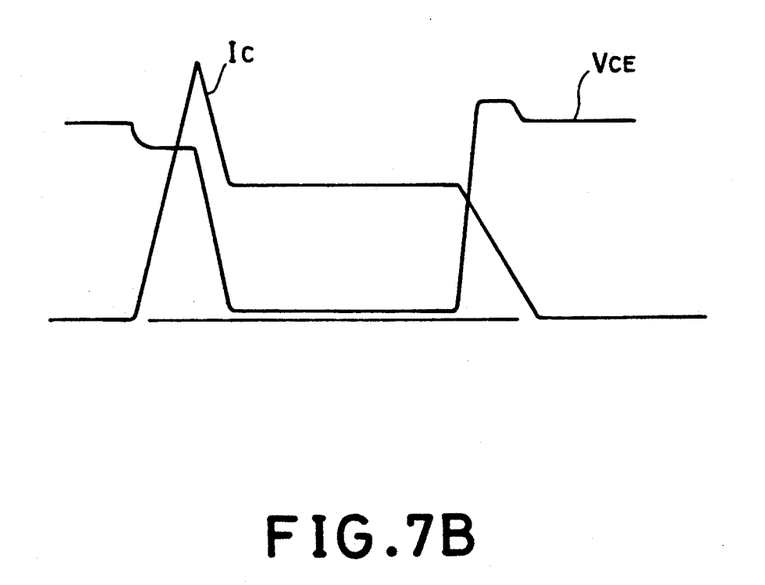

FIGS. 7A and 7B show waveform illustrating the characteristics of turn-on and turn-off of transistor 2A or 2B based on the present invention as compared with the prior art shown in FIG. 1. The collector current of transistor 2A or 2B and the voltage across the collector-emitter are shown as Ic and Vce, respectively. More specifically, FIG. 7A shows the waveforms when a power MOSFET is used as switching transistor 2, in the circuit shown in FIG. 1. FIG. 7B shows the waveforms when the same power MOSFET is used as transistors 2A and 2B in the circuit shown in FIGS. 3 and 4. As shown by the waveforms, the turn-on time shown in FIG. 7B is reduced by approximately half as compared with that shown in FIG. 7A.

Figure 5:
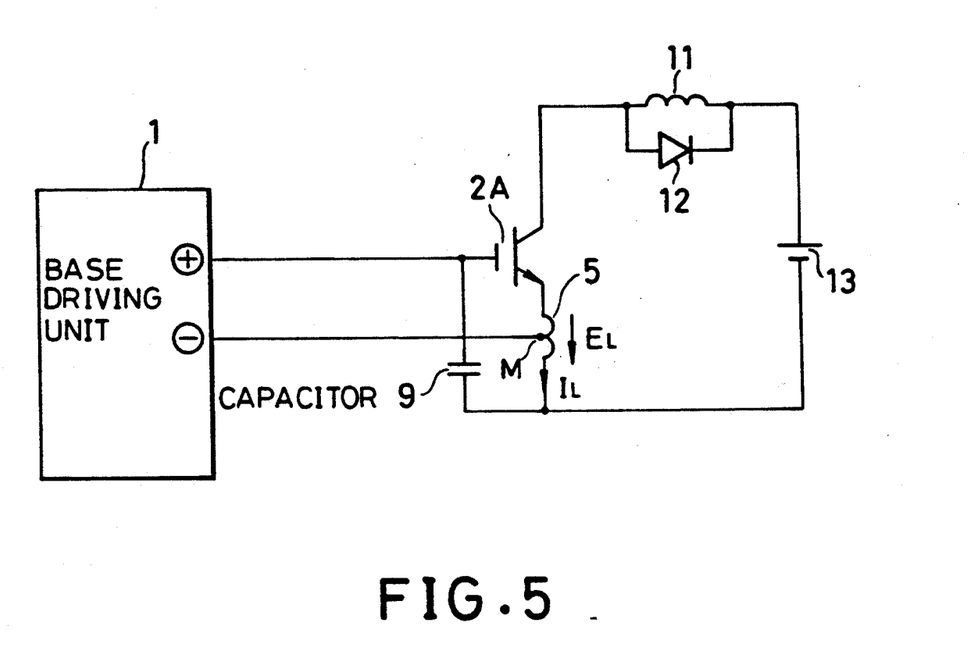

FIG. 5 shows a third embodiment of the present invention, in which a capacitor 9 is used in place of diodes 6 shown in FIG. 3.

Figure 6:
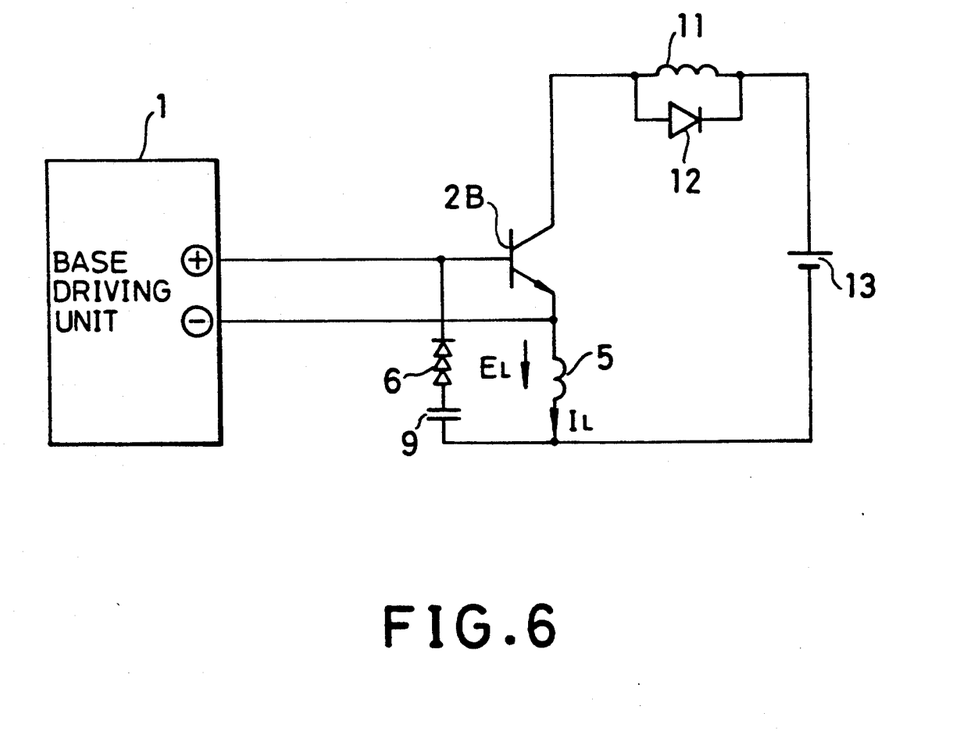

FIG. 6 shows a fourth embodiment of the present invention, in which capacitor 9 is inserted in series with diodes 6 shown in FIG. 4.

By utilizing the circuit shown in FIG. 5 or FIG. 6, the electromotive force EL generated in reactor 5 is supplied to the base of transistor 2A or 2B to maintain the conductive condition of the transistor when the switching transistor is turned off, just as in the above mentioned first and second embodiments. The embodiments in which a capacitor 9 is used are useful for quantitative adjustment of the turn-off speed when the switching transistor is a voltage driving element like an IGB transistor because the electromotive force EL is divided and supplied to capacitor 9 and the interelectrode capacitance between the gate and the emitter, respectively.

Figure 8:
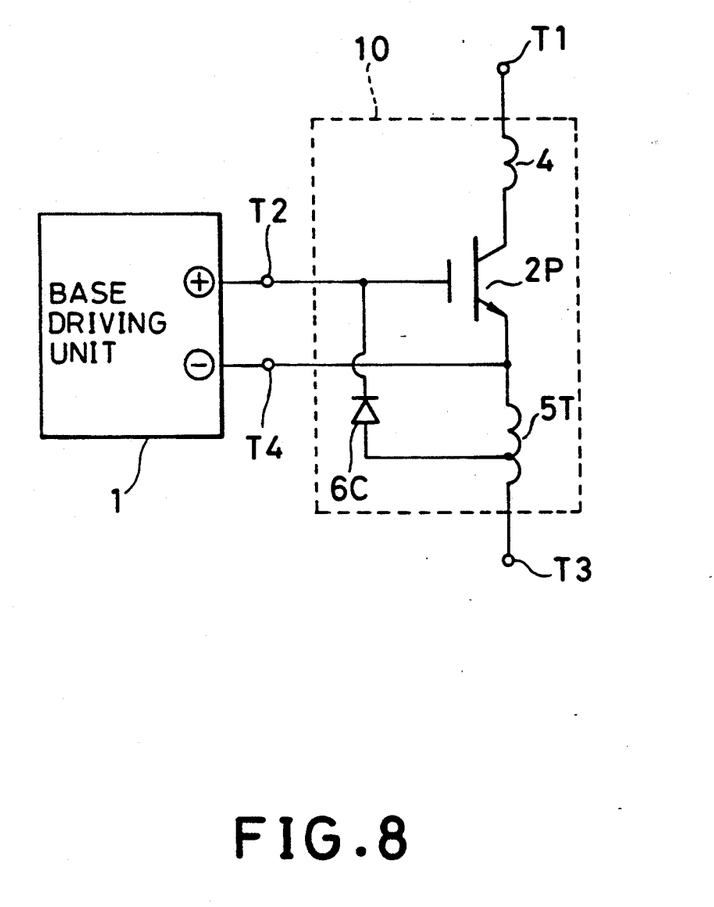
FIGS. 8-10 are electrical schematic diagrams showing three embodiments in which the circuit of the present invention are realized in the form of a semiconductor module.

FIGS. 8 to 12 show embodiments in which the above described circuits of the present invention are realized as semiconductor modules. In FIG. 8, a case 10 is provided for the semiconductor module which comprises a semiconductor chip having switching transistor 2P, an output terminal T1 as the main circuit terminal connected to the collector of switching transistor 2P, a common terminal T3 as the main circuit terminal connected to the emitter of switching transistor 2P, an input terminal T2 for the signal line connected to the gate of switching transistor 2P (the base in the case of the bipolar transistor), and a common terminal T4 for the driving signal connected to the emitter of switching transistor 2P. The semiconductor module also includes a terminal portion inductance 5T constituting a reactor formed between the emitter of switching transistor 2P and common terminal T3, and a diode 6C formed between the middle portion of terminal portion inductance 5T and the gate of switching transistor 2P. In this embodiment, a single diode 6C is used in order to make the semiconductor module simple. As a result, since the inductance of terminal portion inductance 5T becomes large, a part of inductance 5T corresponding to the connecting point up to the intermediate point of the emitter is utilized for applying the electromotive force for the gate electrode. In order to increase the turn-on speed for switching transistor 2P, the lead wire for common terminal T4 is connected to the emitter of switching transistor 2P.

Figure 9:
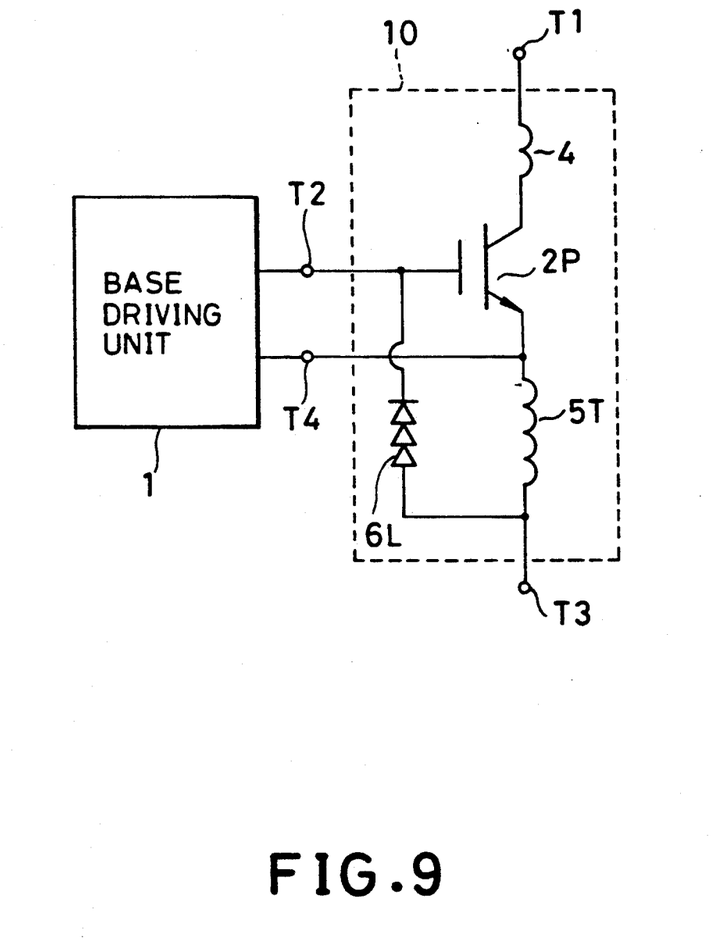

FIG. 9 shows another embodiment of the semiconductor module, which is used when the inductance 5T of the common terminal T3 is large. A laminated diode 6L is used in place of a chip diode to make the forward voltage drop large, whereby the feedback of voltage from the terminal portion inductance 5T into switching transistor 2P is controlled.

Figure 10:
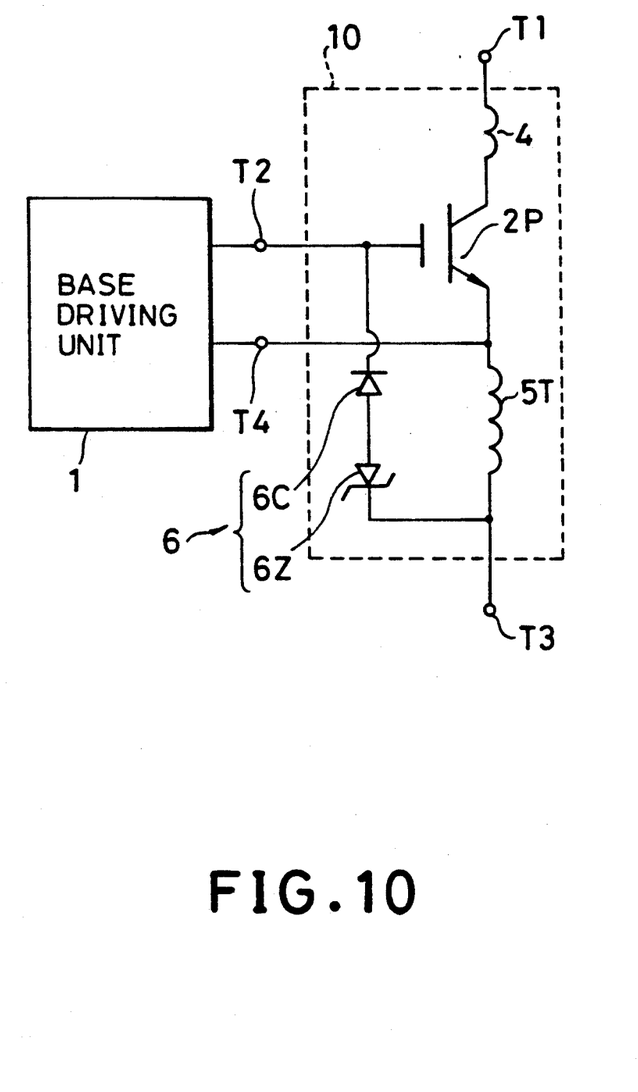

FIG. 10 shows another embodiment of the semiconductor module, in which a zener diode 6Z is connected to diode 6C in series. In the case that the voltage feedback of the inductance 5T cannot be controlled by the forward voltage drop of the laminated diode 6L in the embodiment shown in FIG. 9, the voltage feedback is controlled by the voltage of the zener diode.

Figure 11:
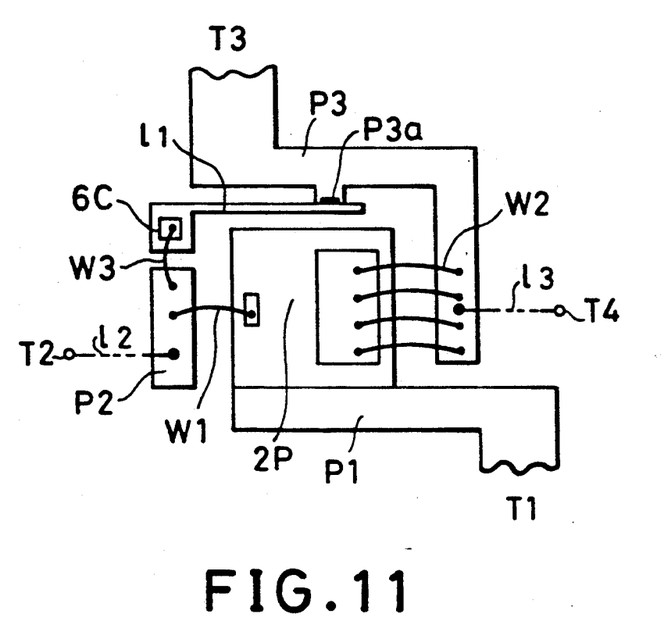
FIGS. 11-12 are schematic diagrams showing two embodiments of the internal connection for the semiconductor module shown in FIG. 8.

FIG. 11 shows another embodiment for the internal connection of the semiconductor module. In FIG. 11, the semiconductor module includes a terminal plate P1 which is made of copper or other material and is connected directly to the collector of the switching transistor 2P at one end and connected to an output T1 at the other end, a junction plate P2 which is made of copper or other material and is connected to the gate of the switching transistor 2P through an aluminum wire W1 and connected to an output terminal T2 through a lead wire L2, and a plate P3, also made of copper or other material connected to the emitter of switching transistor 2P through aluminum wires W2 at one end and connected to a common terminal T3 at the other end. A lead wire L3 is connected across the central portion of the area to which aluminum wire W2 are connected on terminal plate P3 and a common terminal T4 for the signal wire. The above mentioned terminal portion inductance 5T is formed on terminal plate P3. A copper plate lead L1 attached to the anode of diode chip 6C is connected to protruding portion P3a of terminal plate P3. A cathode of diode 6C is connected to junction plate P2 through an aluminum wire W3.

Figure 12:
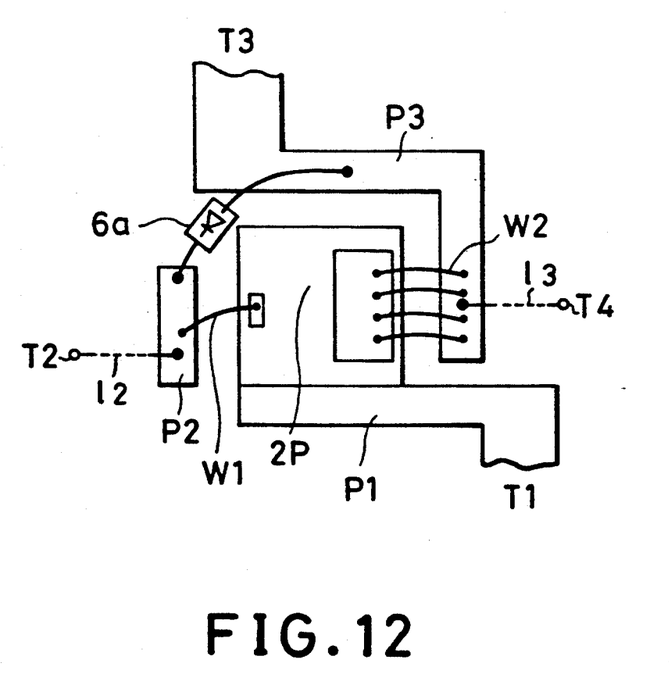

FIG. 12 shows another embodiment of the internal connection of the semiconductor module, in which a molded diode 6A as completed article is used in place of diode chip 6C.

As described above, the invention minimizes repression of the rise time of the drive signal, which is due to reactor 5 at the time of turning transistor 2 off, while the function of repressing the fast turn-off speed of transistor 2 caused by the electromotive force of reactor 5 at the time of turning the switching transistor off is maintained. As a result, the turn-off time of transistor 2 can be speeded up, whereby the turn-on loss of transistor 2 can be reduced.

The above mentioned turn-on speed or turn-off speed can be controlled independently by changing the value of reactor 5, the number of diodes 6 or the value of the circuit constant of diodes 6, or by shifting a position of the intermediate tap of reactor 5.

The invention has been described in detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A control circuit for a switching transistor, comprising;
    a switching transistor having a control electrode and first and second main circuit electrodes;
    a reactor connected in series with the first main circuit electrode of said switching transistor to receive a main circuit current through said switching transistor;
    circuit means connected between one end of said reactor which is remote from said first main electrode and said control electrode of said switching transistor for supplying an electromotive force, generated by said reactor as the main circuit current decreases when said switching transistor is turned off, to said control electrode; and
    control electrode driving means, connected between said control electrode and one of said first main circuit electrode and a predetermined intermediate position on said reactor, for supplying a drive signal to said control electrode for selectively turning said switching transistor on and off.

2. The control circuit as claimed in claim 1, wherein said circuit means comprises at least one of a capacitor and a semiconductor device which produce a predetermined voltage drop in response to the generation of the electromotive force by said reactor.

3. The control circuit as claimed in claim 1, wherein said circuit means comprises a semiconductor element and a capacitor connected in series.

4. The control circuit as claimed in claim 1, wherein said circuit means comprises at least one of a diode and a zener diode.

5. The control circuit as claimed in claim 1, wherein said circuit means comprises a plurality of semiconductor elements.

6. The control as claimed in claim 1 forming a combination with a snubber circuit which has a distributed inductance and which is connected between the firs and second main circuit electrodes of said switching transistor.

7. A switching apparatus comprising:

a transistor having first and second main circuit terminals and a control terminal, said transistor driving an inductive load connected at one end thereof to the first main circuit terminal of the transistor and at another end thereof to a first terminal of a power source;

a coil connected at a first end thereof to the second main terminal of the transistor and at a second end thereof to a second terminal of the power source;

feedback means, coupled between the second end of the coil and the control terminal of the transistor, for feeding back an electromotive force generated by the coil to the control terminal of the transistor when the transistor is turned off; and drive means for providing a control signal to the control terminal of the transistor to turn the transistor on and off.

8. The switching apparatus according to claim 7, wherein the drive means has first and second terminals, and the coil has a center tap terminal, the first terminal of the drive means being coupled to the transistor control terminals and the second terminal of the drive means being coupled to the center tap terminal of the coil.

9. The switching apparatus according to claim 7, wherein the drive means has first and second terminals, the first terminal of the drive means being coupled to the control terminal of the transistor, and the second terminal of the drive means being coupled to the second main terminal of the transistor and the first end of the coil.

10. The switching apparatus according to claim 7, wherein the transistor is an npn bipolar transistor, the first main terminal of the transistor being the collector, the second main terminal of the transistor being the emitter, and the control terminal of the transistor being the base of the npn bipolar transistor.

11. The switching apparatus according to claim 7, wherein the transistor is an insulated gate bipolar transistor, the first main terminal of the transistor being the collector, the second main terminal of the transistor being the emitter, and the control terminal of the transistor being the gate of the insulated gate bipolar transistor.

12. The switching apparatus according to claim 7, wherein the feedback means comprises a diode array.

13. The switching apparatus according to claim 7, wherein the feedback means comprises a capacitor.

14. The switching apparatus according to claim 7, wherein the feedback means comprises a capacitor and a diode array connected in series.

15. The switching apparatus according to claim 7, further comprising a snubber circuit connected across the inductive load.

16. A switching apparatus comprising:

a transistor having first and second main circuit terminals and a control terminal, said transistor driving an inductive load connected at one end thereof to the first main circuit terminal of the transistor and at another end thereof to a first terminal of a power source;

a coil connected at a first end thereof to the second main terminal of the transistor and at a second end thereof to a second terminal of the power source, the coil having a tap terminal;

feedback means, coupled between the tap terminal of the coil and the control terminal of the transistor, for feeding back an electromotive force generated by the coil to the control terminal of the transistor when the transistor is turned off; and drive means for providing a control signal to the control terminal of the transistor to turn the transistor on and off.

17. The switching apparatus according to claim 16, wherein the drive means has first and second terminals, the first terminal of the drive means being coupled to the transistor control terminal, and the second terminal of the drive means being coupled to the second main terminal of the transistor.

18. The switching apparatus according to claim 16, wherein the feedback means comprises a diode.

19. The switching apparatus according to claim 16, wherein the transistor is an insulated gate bipolar transistor, the first main terminal of the transistor being the collector, the second main terminal of the transistor being the emitter, and the control terminal of the transistor being the gate of the insulated gate bipolar transistor.

20. The switching apparatus according to claim 16, wherein at least the transistor and the coil are formed as elements of an integrated circuit module.

* * * * *